United States Patent
Kim et al.

(10) Patent No.: US 12,282,250 B2
(45) Date of Patent: Apr. 22, 2025

(54) PELLICLE FOR EXTREME ULTRAVIOLET LITHOGRAPHY BASED ON YTTRIUM

(71) Applicant: KOREA ELECTRONICS TECHNOLOGY INSTITUTE, Seongnam-si (KR)

(72) Inventors: Hyeong Keun Kim, Yongin-si (KR); Seul Gi Kim, Yongin-si (KR); Hyun Mi Kim, Seoul (KR); Jin Woo Cho, Seoul (KR); Ki Hun Seong, Anyang-si (KR)

(73) Assignee: KOREA ELECTRONICS TECHNOLOGY INSTITUTE, Seongnam-si (KR)

( * ) Notice: Subject to any disclaimer, the term of this patent is extended or adjusted under 35 U.S.C. 154(b) by 575 days.

(21) Appl. No.: 17/698,383

(22) Filed: Mar. 18, 2022

(65) Prior Publication Data

US 2022/0326601 A1 Oct. 13, 2022

(30) Foreign Application Priority Data

Apr. 12, 2021 (KR) .......................... 10-2021-0047239

(51) Int. Cl.
*G03F 1/62* (2012.01)
*G03F 1/22* (2012.01)
*G03F 7/00* (2006.01)

(52) U.S. Cl.
CPC .................. *G03F 1/62* (2013.01); *G03F 1/22* (2013.01); *G03F 7/70983* (2013.01)

(58) Field of Classification Search
CPC ..................................... G03F 1/62; G03F 1/64
USPC ............................................................ 430/5
See application file for complete search history.

(56) References Cited

U.S. PATENT DOCUMENTS

| | | | |
|---|---|---|---|
| 10,073,337 B2 | 9/2018 | Jung et al. | |
| 10,228,615 B2 | 3/2019 | Nikipelov et al. | |
| 10,859,901 B2 * | 12/2020 | Nam | G03F 1/62 |
| 11,927,881 B2 * | 3/2024 | Kim | G03F 1/62 |
| 2018/0259845 A1 | 9/2018 | Nam et al. | |
| 2019/0146324 A1 | 5/2019 | Nam et al. | |
| 2019/0265585 A1 | 8/2019 | Ikebe et al. | |
| 2020/0406244 A1 | 12/2020 | Kurganova et al. | |
| 2022/0035239 A1 * | 2/2022 | Van Zwol | G03F 7/70191 |
| 2022/0334464 A1 * | 10/2022 | Kim | G03F 1/62 |

FOREIGN PATENT DOCUMENTS

| | | |
|---|---|---|
| CN | 105051604 B | 7/2019 |
| CN | 110501769 A | 11/2019 |
| EP | 2124102 A2 | 11/2009 |
| EP | 3373070 A1 | 9/2018 |
| JP | 2018-151622 A | 9/2018 |
| JP | 2018-536902 A | 12/2018 |
| JP | 2019-515322 A | 6/2019 |
| KR | 10-2016-0127218 A | 11/2016 |
| KR | 10-2017-0029556 A | 3/2017 |
| KR | 10-1726125 B1 | 4/2017 |
| KR | 10-2018-0094084 A | 8/2018 |
| KR | 10-2018-0135490 A | 12/2018 |
| KR | 10-2021-0031664 A | 3/2021 |
| TW | 201827916 A | 8/2018 |
| TW | 201834017 A | 9/2018 |
| TW | 201918372 A | 5/2019 |
| WO | WO 2017/102379 A1 | 6/2017 |
| WO | WO 2017/186486 A1 | 11/2017 |
| WO | 2020/078721 A1 | 4/2020 |

OTHER PUBLICATIONS

Extended European Search Report in EP Application No. 22164601.1 dated Sep. 2, 2022.
Office Action of the corresponding Japanese Application No. 2022-064507 dated Apr. 18, 2023.
Office Action of the corresponding Korean Application No. 10-2021-0047239 dated Jun. 13, 2023.
Office Action of Corresponding TW patent application No. 111,113,315 (issued on Nov. 15, 2022).
Notice of Allowance received in Korean Patent Application No. 10-2021-0047239, mailed Jun. 13, 2024.

* cited by examiner

*Primary Examiner* — Christopher G Young
(74) *Attorney, Agent, or Firm* — Knobbe, Martens Olson & Bear, LLP (57) ABSTRACT

This application relates to a pellicle for extreme ultraviolet lithography based on yttrium (Y) and used in a lithography process using extreme ultraviolet rays. In one aspect, the pellicle includes a pellicle layer including a core layer formed of an yttrium-based material expressed as Y-M (M is one of B, Si, O, or F).

16 Claims, 8 Drawing Sheets

PELLICLE FOR EXTREME ULTRAVIOLET LITHOGRAPHY BASED ON YTTRIUM

CROSS-REFERENCE TO RELATED APPLICATION

The present application claims priority to Korean Patent Application No. 10-2021-0047239 filed on Apr. 12, 2021 in the Korean Intellectual Property Office, which is 10 incorporated herein in its entirety by reference.

BACKGROUND

Technical Field

The present disclosure relates to a semiconductor lithography technology. More particularly, the present disclosure relates to a pellicle for extreme ultraviolet lithography based on yttrium (Y) and installed in a mask used in a lithography process using extreme ultraviolet rays.

Description of Related Technology

As the semiconductor industry continues to develop and the degree of semiconductor integration is dramatically improved, electronic devices are becoming smaller and lighter. In order to further improve the degree of semiconductor integration, the advancement of lithography technology is required.

Currently, technology is developing toward realizing a fine pattern of a semiconductor by reducing the wavelength of light. Extreme ultraviolet (EUV) lithography technology, recently developed as a next-generation technology, can realize a fine pattern through a single resist process.

SUMMARY

The present disclosure provides an yttrium-based pellicle for extreme ultraviolet lithography having an extreme ultraviolet transmittance of 90% or more in an extreme ultraviolet output environment of 350 W or more.

In addition, the present disclosure provides an yttrium-based pellicle for extreme ultraviolet lithography having thermal stability, mechanical stability and chemical durability while having a high extreme ultraviolet transmittance of 90% or more.

According to embodiments of the present disclosure, a pellicle for extreme ultraviolet lithography may include a pellicle layer including a core layer formed of an yttrium-based material expressed as Y-M (M is one of B, Si, O, and F).

In the pellicle, the yttrium-based material may include Y—$B_x$ (x≥2), Y—$Si_x$ (x≥1), $Y_2O_3$, or $YF_3$.

In the pellicle, the yttrium-based material may include $YB_2$, $YB_4$, $YB_6$, $YB_{12}$, $YB_{25}$, $YB_{50}$, or $YB_{66}$.

In the pellicle, the yttrium-based material may include $YSi_2$ or $Y_3Si_5$.

In the pellicle, the pellicle layer may include the core layer; and a capping layer formed on one or both surfaces of the core layer, wherein a material of the capping layer may be expressed as Y-M-α (M is one of B, Si, O, and F, and a is one of Si, C, B, N, O, and Ru).

In the pellicle, the material of the capping layer may include $YC_xSi_y$ (x+y≥1), $YC_xB_y$ (x+y≥1), $YSi_xN_y$ (x+y≥1), $YC_x$ (x≥1), $YSi_x$ (x≥1), $YN_x$ (x≥1), $SiN_x$ (x≥1), $SiO_2$, $B_4C$, or RuC.

In the pellicle, the pellicle layer may include the core layer; an intermediate layer formed on one or both surfaces of the core layer; and a capping layer formed on the intermediate layer, wherein a material of each of the intermediate layer and the capping layer may be expressed as Y-M-α (M is one of B, Si, O, and F, and a is one of Si, C, B, N, O, and Ru).

In the pellicle, the material of each of the intermediate layer and the capping layer may include $YC_xSi_y$ (x+y≥1), $YC_xB_y$ (x+y≥1), $YSi_xN_y$ (x+y≥1), $YC_x$ (x≥1), $YSi_x$ (x≥1), $YN_x$ (x≥1), $SiN_x$ (x≥1), $SiO_2$, $B_4C$, or RuC.

According to embodiments of the present disclosure, a pellicle for extreme ultraviolet lithography may include a substrate having an opening formed in a central portion thereof; and a pellicle layer formed on the substrate so as to cover the opening and including a core layer formed of an yttrium-based material expressed as Y-M (M is one of B, Si, O, and F).

According to the present disclosure, using Y-M (M is one of B, Si, O, and F) material based on yttrium (Y) with chemical durability and mechanical stability as the material of the core layer of the pellicle layer makes it possible to provide the pellicle having an extreme ultraviolet transmittance of 90% or more in an extreme ultraviolet output environment of 350 W or more. That is, by depositing the Y-M material, which is a metal-based compound in which yttrium is combined with B capable of reinforcing mechanical strength, Si having high optical properties, or the like, on the substrate to form the core layer, it is possible to provide the pellicle having an extreme ultraviolet transmittance of 90% or more and a reflectance of 0.04% or less.

In addition, the pellicle according to the present disclosure including the Y-M material as the core layer can provide thermal stability, mechanical stability, and chemical durability while having a high extreme ultraviolet transmittance of 90% or more.

DETAILED DESCRIPTION

An extreme ultraviolet lithography apparatus used in a semiconductor process includes a light source power, a resist, a pellicle, and a mask. The pellicle is installed on the mask to prevent contaminants generated during the lithography process from adhering to the mask, and is selectively used depending on the lithography machine.

In the extreme ultraviolet lithography process, there was an expectation that the pellicle would not be needed because a clean system was built. However, it has been known that during an actual operation after the construction of the lithography apparatus, contamination of the mask is caused by foreign substances generated from an internal driving unit of the apparatus, particles of tin generated in the oscillation of the light source, and extreme ultraviolet photoresist.

Therefore, in the extreme ultraviolet lithography process, the pellicle is recognized as an essential component so as to prevent contamination of the mask. When the pellicle is used, defects smaller than 10,000 nm in size are negligible.

The pellicle for extreme ultraviolet lithography is required to have a size of 110 mm×144 mm to cover the mask, and an extreme ultraviolet transmittance of 90% or more is required in order to minimize deterioration of productivity due to loss of a light source. In addition, mechanical stability that the pellicle is not damaged by physical movement up to 20 G inside the extreme ultraviolet lithography apparatus, and thermal stability that the pellicle can withstand a thermal load of 250 W or more based on a 5 nm node are required. Also, chemical durability that the pellicle does not react to hydrogen radicals generated in an extreme ultraviolet environment is required.

Currently, pellicle development companies are developing transmissive materials based on polycrystalline silicon (p-Si) or SiN. However, such materials do not satisfy a transmittance of 90% or more, which is the most important condition of a pellicle for extreme ultraviolet lithography. Also, such materials have weaknesses in thermal stability, mechanical stability, and chemical durability in an extreme ultraviolet lithography environment, so that process development research is being conducted to supplement their properties. For example, materials such as Mo, Ru, and Zr have been selected and studied as materials for solving the problems of SiN-based materials, but it is difficult to manufacture a thin film and maintain its shape.

Recently, a pellicle having an extreme ultraviolet transmittance of 90% or more and thermal, chemical, and mechanical stability in an extreme ultraviolet output environment of 350 W or more, exceeding an irradiation intensity of 250 W level, is required.

Hereinafter, an embodiment of the present disclosure will be described in detail with reference to the accompanying drawings. The present disclosure may, however, be embodied in many different forms and should not be construed as being limited to the embodiment set forth herein. Rather, this embodiment is provided so that the disclosure will be thorough and complete and will fully convey the scope of the disclosure to those skilled in the art. Accordingly, an embodiment described herein should be understood to include various modifications, equivalents, and/or alternatives.

In addition, techniques that are well known in the art and not directly related to the present disclosure are not described herein. This is to clearly convey the subject matter of the present disclosure by omitting an unnecessary explanation. Also, the terms are merely used for describing a particular embodiment but do not limit the embodiment. Singular forms are intended to include plural forms unless the context clearly indicates otherwise.

First Embodiment

Figure 1:
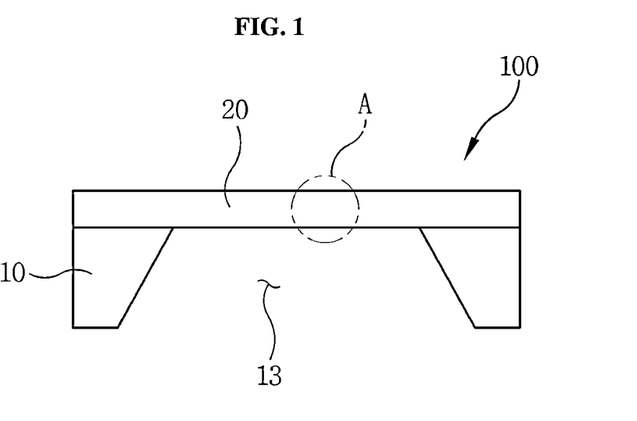
FIG. 1 is a cross-sectional view showing an yttrium-based pellicle for extreme ultraviolet lithography according to a first embodiment of the present disclosure.
Figure 2:
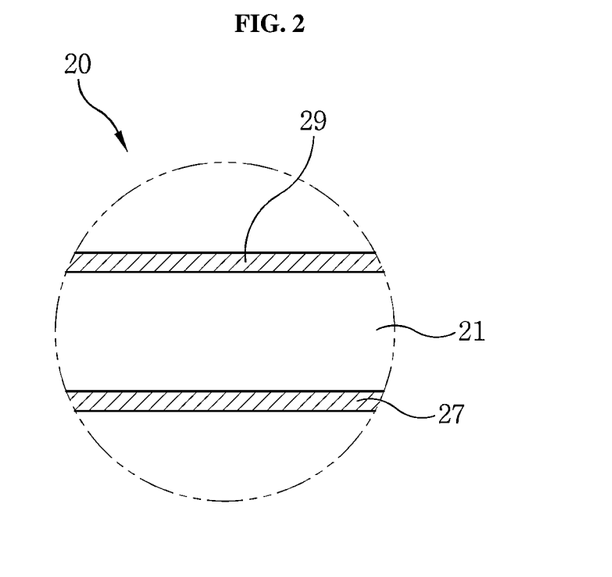
FIG. 2 is an enlarged view of part A of FIG. 1.

FIG. 1 is a cross-sectional view showing an yttrium-based pellicle for extreme ultraviolet lithography according to a first embodiment of the present disclosure. FIG. 2 is an enlarged view of part A of FIG. 1.

Referring to FIGS. 1 and 2, a pellicle 100 for extreme ultraviolet lithography according to the first embodiment (hereinafter referred to as 'pellicle') includes a substrate 10 having an opening 13 formed in its central portion, and a pellicle layer 20 formed on the substrate 10 so as to cover the opening 13 and including, as a core layer 21, an yttrium-based material expressed as Y-M (M is one of B, Si, O, and F). The pellicle layer 20 may include the core layer 21 and capping layers 27 and 29 that are stacked on the substrate 10. The capping layers 27 and 29 may be formed on one or both surfaces of the core layer 21.

The pellicle 100 is a consumable component that protects a mask from contaminants in a lithography process for semiconductor or display manufacturing. That is, the pellicle 100 is a thin film overlying the mask and serves as a cover. Because the light transferred to the wafer is focused with the mask in a lithographic exposure, even if contaminants exist on the pellicle 100 that is separated by a certain distance, it is possible to minimize a problem of forming a defective pattern due to out of focus.

As such, the pellicle 100 may minimize defective patterns while protecting the mask from contaminants during the exposure process, thereby greatly increasing the yield of semiconductor or display manufacturing. In addition, the use of the pellicle 100 can increase the lifespan of the mask.

Now, the pellicle 100 according to the present disclosure will be described in detail.

The substrate 10 supports the pellicle layer 20 and makes it easy to handle and transport the pellicle 100 during and after the process of manufacturing the pellicle 100. The substrate 10 may be formed of a material such as silicon available for an etching process. For example, the material of the substrate 10 includes, but is not limited to, silicon, silicon oxide, silicon nitride, metal oxide, metal nitride, graphite, amorphous carbon, or a laminated structure of such materials. Here, metal may be, but is not limited to, Cr, Al, Zr, Ti, Ta, Nb, Ni, or the like.

The opening 13 in the central portion of the substrate 10 may be formed using a micro-machining technique such as micro-electro mechanical systems (MEMS). That is, the opening 13 is formed by removing the central portion of the substrate 10 by means of the micro-machining technique. The opening 13 partially exposes the pellicle layer 20.

The pellicle layer 20 includes the core layer 21 and the capping layers 27 and 29.

The core layer 21 is a layer that determines the transmittance of extreme ultraviolet rays. The core layer 21 has a transmittance of 90% or more for extreme ultraviolet rays, and effectively dissipates heat to prevent overheating of the pellicle layer 20.

The core layer 21 is formed of an yttrium-based material expressed as Y-M (M is one of B, Si, O, and F). The yttrium-based material includes Y—$B_x$ (x≥2), Y—$Si_x$ (x≥1), $Y_2O_3$, or $YF_3$. Here, Y—$B_x$ (x≥2) may include $YB_2$, $YB_4$, $YB_6$, $YB_{12}$, $YB_{25}$, $YB_{50}$, or $YB_{66}$. Also, Y—$Si_x$ (x≥1) may include $YSi_2$ or $Y_3Si_5$.

Figure 3:
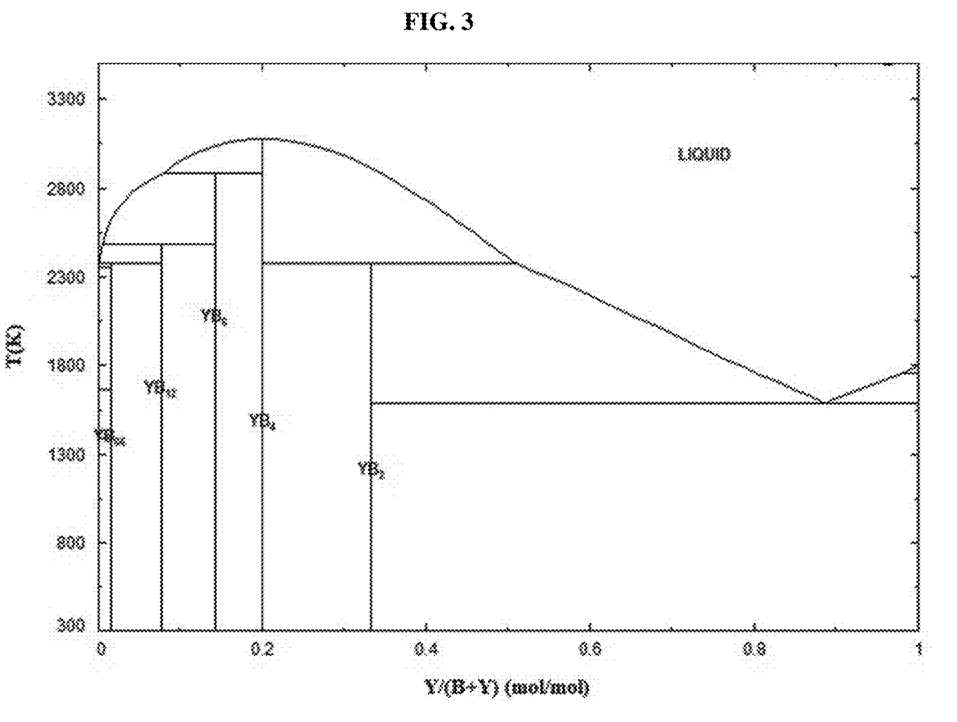
FIG. 3 is a graph showing the melting point of Y—$B_x$ (x≥2) used as a material of the core layer shown in FIG. 1.

As shown in FIG. 3, because Y—$B_x$ (x≥2) has a high melting point like a metal-B material, and it has excellent thermal stability and high mechanical strength. Although Y—$B_x$ (x≥2) may have various compositions, $YB_2$, $YB_4$, $YB_6$, $YB_{12}$, $YB_{25}$, $YB_{50}$, or $YB_{66}$ has a stable phase. For example, $YB_4$ has a melting point of about 3100° C. and forms the most stable phase among Y—$B_x$ (x≥2).

The reason for using the yttrium-based material as the material of the core layer 21 is as follows.

Using Y-M (M is one of B, Si, O, and F) material based on yttrium (Y) with chemical durability and mechanical stability as the material of the core layer 21 makes it possible to provide the pellicle 100 having an extreme ultraviolet transmittance of 90% or more in an extreme ultraviolet output environment of 350 W or more. That is, by depositing the Y-M material, which is a metal-based compound in which yttrium is combined with B capable of reinforcing mechanical strength, Si having high optical properties, or the like, on the substrate 10 to form the core layer 21, it is possible to provide the pellicle 100 having an extreme ultraviolet transmittance of 90% or more and a reflectance of 0.04% or less.

In addition, the capping layers 27 and 29 provide thermal stability, mechanical stability, and chemical durability to the pellicle layer 20 while minimizing a decrease in the transmittance of the core layer 21 for extreme ultraviolet rays. Specifically, the capping layers 27 and 29 are protective layers for the core layer 21 and provide thermal stability by effectively dissipating heat generated in the core layer 21 to the outside. Also, the capping layers 27 and 29 provide mechanical stability by supplementing the mechanical strength of the core layer 21. Further, the capping layers 27 and 29 provide chemical durability by protecting the core layer 21 from hydrogen radicals and oxidation.

The capping layers 27 and 29 may be formed on one or both surfaces of the core layer 21. The capping layers 27 and 29 according to the first embodiment include a first capping layer 27 formed on a lower surface of the core layer 21 and a second capping layer 29 formed on an upper surface of the core layer 21.

The first capping layer 27 is interposed between the substrate 10 and the core layer 21, is formed of a material having resistance to KOH, and prevents the material of the core layer 21 from diffusing into the substrate 10.

The material of the first and second capping layers 27 and 29 includes a material expressed as Y-M-α (M is one of B, Si, O, and F, and a is one of Si, C, B, N, O, and Ru). For example, the Y-M-α material may include $YC_xSi_y$ (x+y≥1), $YC_xB_y$ (x+y≥1), $YSi_xN_y$ (x+y≥1), $YC_x$ (x≥1), $YSi_x$ (x≥1), $YN_x$ (x≥1), $SiN_x$ (x≥1), $SiO_2$, $B_4C$, or RuC.

The reason for using the Y-M-α material as the material of the first and second capping layers 27 and 29 is as follows.

In a conventional pellicle, there was a need to form the capping layer to a thickness of 5 nm or less in order to ensure a high extreme ultraviolet transmittance. However, by using, as the material of the first and second capping layers 27 and 29, the Y-M-α material in which the a material is added to the Y-M material used for the core layer 21, it is possible to provide the pellicle 100 not only having a high extreme ultraviolet transmittance of 90% or more but also having thermal stability, mechanical stability and chemical durability even if the capping layers 27 and 29 are formed to a thickness of 10 nm.

As such, the pellicle 100 according to the first embodiment including the Y-M material as the core layer 21 may provide thermal stability, mechanical stability, and chemical durability while having a high extreme ultraviolet transmittance of 90% or more.

The above-described pellicle 100 according to the first embodiment may be manufactured by the following manufacturing process. First, in order to form the pellicle layer 20, the first capping layer 27, the core layer 21, and the second capping layer 29 are sequentially stacked on the substrate 10 in which the opening 13 is not formed.

At this time, each of the first capping layer 27, the core layer 21, and the second capping layer 29 may be formed by a chemical vapor deposition (CVD) process, an atomic layer deposition (ALD) process, an e-beam evaporation process, or a sputtering process.

Thereafter, by removing the central portion of the substrate 10 under the pellicle layer 20 to form the opening 13 through which a lower surface of the pellicle layer 20 is partially exposed, the pellicle 100 according to the first embodiment can be obtained. That is, the opening 13 is formed by removing the central portion of the substrate 10 under the first capping layer 27 through wet etching. The opening 13 partially exposes the first capping layer 27.

Second Embodiment

Figure 4:
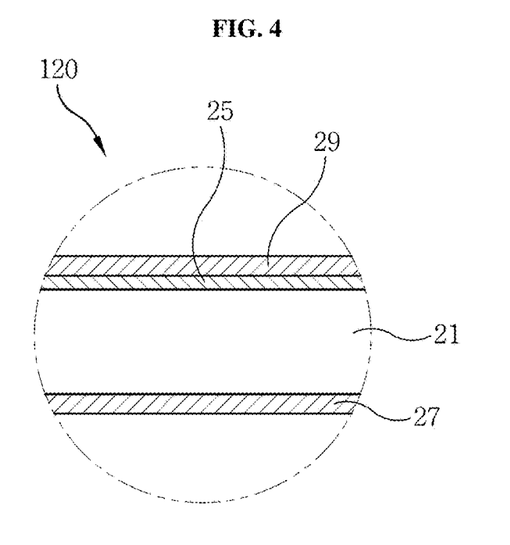
FIG. 4 is an enlarged view showing an yttrium-based pellicle for extreme ultraviolet lithography according to a second embodiment of the present disclosure.

FIG. 4 is an enlarged view showing an yttrium-based pellicle for extreme ultraviolet lithography according to a second embodiment of the present disclosure.

Referring to FIG. 4, a pellicle according to the second embodiment includes a substrate having an opening formed in its central portion, and a pellicle layer 120 formed on the substrate so as to cover the opening and including, as a core layer 21, an yttrium-based material expressed as Y-M (M is one of B, Si, O, and F). The pellicle layer 120 may include the core layer 21, an intermediate layer 25, and capping layers 27 and 29 that are stacked on the substrate. Each of the intermediate layer 25 and the capping layers 27 and 29 may be formed on one or both surfaces of the core layer 21.

The pellicle according to the second embodiment has the same structure as the pellicle (100 in FIG. 1) according to the first embodiment except that the intermediate layer 25 is added.

The core layer 21 is formed of an yttrium-based material expressed as Y-M (M is one of B, Si, O, and F). The yttrium-based material includes Y—$B_x$ (x≥2), Y—$Si_x$ (x≥1), $Y_2O_3$, or $YF_3$. Here, Y—$B_x$ (x≥2) may include $YB_2$, $YB_4$, $YB_6$, $YB_{12}$, $YB_{25}$, $YB_{50}$, or $YB_{66}$. Also, Y—$Si_x$ (x≥1) may include $YSi_2$ or $Y_3Si_5$.

The capping layers 27 and 29 include a first capping layer 27 formed on a lower surface of the core layer 21 and a second capping layer 29 formed on an upper surface of the core layer 21.

The material of the first and second capping layers 27 and 29 includes a material expressed as Y-M-α (M is one of B, Si, O, and F, and a is one of Si, C, B, N, O, and Ru). For example, the Y-M-α material may include $YC_xSi_y$ (x+y≥1), $YC_xB_y$ (x+y≥1), $YSi_xN_y$ (x+y≥1), $YC_x$ (x≥1), $YSi_x$ (x≥1), $YN_x$ (x≥1), $SiN_x$ (x≥1), $SiO_2$, $B_4C$, or RuC.

The intermediate layer 25 is interposed between the core layer 21 and each of the capping layers 27 and 29. The intermediate layer 25 functions as a protective layer for relieving thermal stress due to thermal expansion and preventing diffusion. The intermediate layer 25 may serve as a buffer layer to increase a bonding force between the core layer 21 and each of the capping layers 27 and 29 forming the interface. The intermediate layer 25 according to the second embodiment is an example of being formed between the core layer 21 and the second capping layer 29.

The material of the intermediate layer 25 includes a material expressed as Y-M-α (M is one of B, Si, O, and F, and α is one of Si, C, B, N, O, and Ru). For example, the Y-M-α material may include $YC_xSi_y$ (x+y≥1), $YC_xB_y$ (x+y≥1), $YSi_xN_y$ (x+y≥1), $YC_x$ (x≥1), $YSi_x$ (x≥1), $YN_x$ (x≥1), $SiN_x$ (x≥1), $SiO_2$, $B_4C$, or RuC.

As such, the pellicle according to the second embodiment including the Y-M material as the core layer 21 may provide thermal stability, mechanical stability, and chemical durability while having a high extreme ultraviolet transmittance of 90% or more.

The above-described pellicle according to the second embodiment may be manufactured by the following manufacturing process. First, in order to form the pellicle layer 120, the first capping layer 27, the core layer 21, the intermediate layer 25, and the second capping layer 29 are sequentially stacked on the substrate 10 in which the opening 13 is not formed.

At this time, each of the first capping layer 27, the core layer 21, the intermediate layer 25, and the second capping layer 29 may be formed by a CVD process, an ALD process, an e-beam evaporation process, or a sputtering process.

Thereafter, by removing the central portion of the substrate 10 under the pellicle layer 120 to form the opening through which a lower surface of the pellicle layer 120 is partially exposed, the pellicle according to the second embodiment can be obtained. That is, the opening is formed by removing the central portion of the substrate under the first capping layer 27 through wet etching. The opening partially exposes the first capping layer 27.

Third Embodiment

Figure 5:
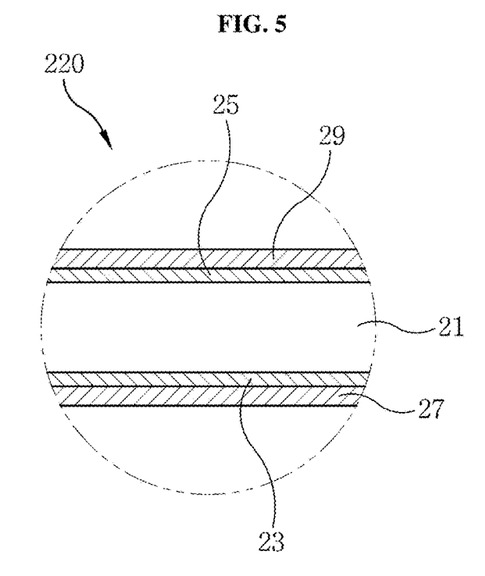
FIG. 5 is an enlarged view showing an yttrium-based pellicle for extreme ultraviolet lithography according to a third embodiment of the present disclosure.

FIG. 5 is an enlarged view showing an yttrium-based pellicle for extreme ultraviolet lithography according to a third embodiment of the present disclosure.

Referring to FIG. 5, a pellicle according to the third embodiment includes a substrate having an opening formed in its central portion, and a pellicle layer 220 formed on the substrate so as to cover the opening and including, as a core layer 21, an yttrium-based material expressed as Y-M (M is one of B, Si, O, and F). The pellicle layer 220 may include the core layer 21, intermediate layers 23 and 25, and capping layers 27 and 29 that are stacked on the substrate.

The pellicle according to the third embodiment has the same structure as the pellicle (100 in FIG. 1) according to the first embodiment except that the intermediate layers 23 and 25 are added.

The core layer 21 is formed of an yttrium-based material expressed as Y-M (M is one of B, Si, O, and F). The yttrium-based material includes $Y—B_x$ (x≥2), $Y—Si_x$ (x≥1), $Y_2O_3$, or $YF_3$. Here, $Y—B_x$ (x≥2) may include $YB_2$, $YB_4$, $YB_6$, $YB_{12}$, $YB_{25}$, $YB_{50}$, or $YB_{66}$. Also, $Y—Si_x$ (x≥1) may include $YSi_2$ or $Y_3Si_5$.

The capping layers 27 and 29 include a first capping layer 27 formed on a lower surface of the core layer 21 and a second capping layer 29 formed on an upper surface of the core layer 21.

The material of the first and second capping layers 27 and 29 includes a material expressed as Y-M-α (M is one of B, Si, O, and F, and α is one of Si, C, B, N, O, and Ru). For example, the Y-M-α material may include $YC_xSi_y$ (x+y≥1), $YC_xB_y$ (x+y≥1), $YSi_xN_y$ (x+y≥1), $YC_x$ (x≥1), $YSi_x$ (x≥1), $YN_x$ (x≥1), $SiN_x$ (x≥1), $SiO_2$, $B_4C$, or RuC.

The intermediate layers 23 and 25 are interposed between the core layer 21 and the capping layers 27 and 29. The intermediate layers 23 and 25 function as a protective layer for relieving thermal stress due to thermal expansion and preventing diffusion. The intermediate layers 23 and 25 may serve as a buffer layer to increase a bonding force between the core layer 21 and the capping layers 27 and 29 forming the interface. The intermediate layers 23 and 25 according to the third embodiment include a first intermediate layer 23 formed between the core layer 21 and the first capping layer 27, and a second intermediate layer 25 formed between the core layer 21 and the second capping layer 29.

The material of the intermediate layers 23 and 25 includes a material expressed as Y-M-α (M is one of B, Si, O, and F, and α is one of Si, C, B, N, O, and Ru). For example, the Y-M-α material may include $YC_xSi_y$ (x+y≥1), $YC_xB_y$ (x+y≥1), $YSi_xN_y$ (x+y≥1), $YC_x$ (x≥1), $YSi_x$ (x≥1), $YN_x$ (x≥1), $SiN_x$ (x≥1), $SiO_2$, $B_4C$, or RuC.

As such, the pellicle according to the third embodiment including the Y-M material as the core layer 21 may provide thermal stability, mechanical stability, and chemical durability while having a high extreme ultraviolet transmittance of 90% or more.

The above-described pellicle according to the third embodiment may be manufactured by the following manufacturing process. First, in order to form the pellicle layer 220, the first capping layer 27, the first intermediate layer 23, the core layer 21, the second intermediate layer 25, and the second capping layer 29 are sequentially stacked on the substrate 10 in which the opening 13 is not formed.

At this time, each of the first capping layer 27, the first intermediate layer 23, the core layer 21, the second intermediate layer 25, and the second capping layer 29 may be formed by a CVD process, an ALD process, an e-beam evaporation process, or a sputtering process.

Thereafter, by removing the central portion of the substrate 10 under the pellicle layer 220 to form the opening through which a lower surface of the pellicle layer 220 is partially exposed, the pellicle according to the third embodiment can be obtained. That is, the opening is formed by removing the central portion of the substrate under the first capping layer 27 through wet etching. The opening partially exposes the first capping layer 27.

Experimental Examples

In order to check the transmittance and reflectance of the pellicle according to the present disclosure in an extreme ultraviolet output environment of 350 W or more, simulations were performed on the pellicles according to first to sixth experimental examples as shown in FIGS. 6 to 11.

The pellicles according to the first to sixth experimental examples include the pellicle layer according to the first embodiment. That is, the pellicle layer includes the first capping layer, the core layer, and the second capping layer. The material of the first and second capping layers is $SiN_x$. The material of the core layer is an yttrium-based material.

When the thickness of the first capping layer is 5 nm, the transmittance and reflectance of the pellicle according to each of the first to sixth experimental examples were simulated in an extreme ultraviolet output environment of 350 W while changing the thickness of the core layer between 0 nm and 30 nm and the thickness of the capping layer between 0 nm and 10 nm.

The materials of the core layer according to the first to sixth experimental examples are Y, $YB_2$, $YB_4$, $YB_6$, $YB_{12}$, and $YB_{66}$.

The pellicles according to the first to sixth experimental examples were expressed as "SiN_C(0 nm)_YBx_SiN(5 nm)". Here, 'SiN(5 nm)' denotes the first capping layer. In addition, 'YBx' denotes the core layer, and x is 0, 2, 4, 6, 12, and 66. Also, 'C(0 nm)' denotes the intermediate layer, but the intermediate layer was not applied in the first and sixth experimental examples. And 'SiN' denotes the second capping layer.

First Experimental Example

Figure 6:
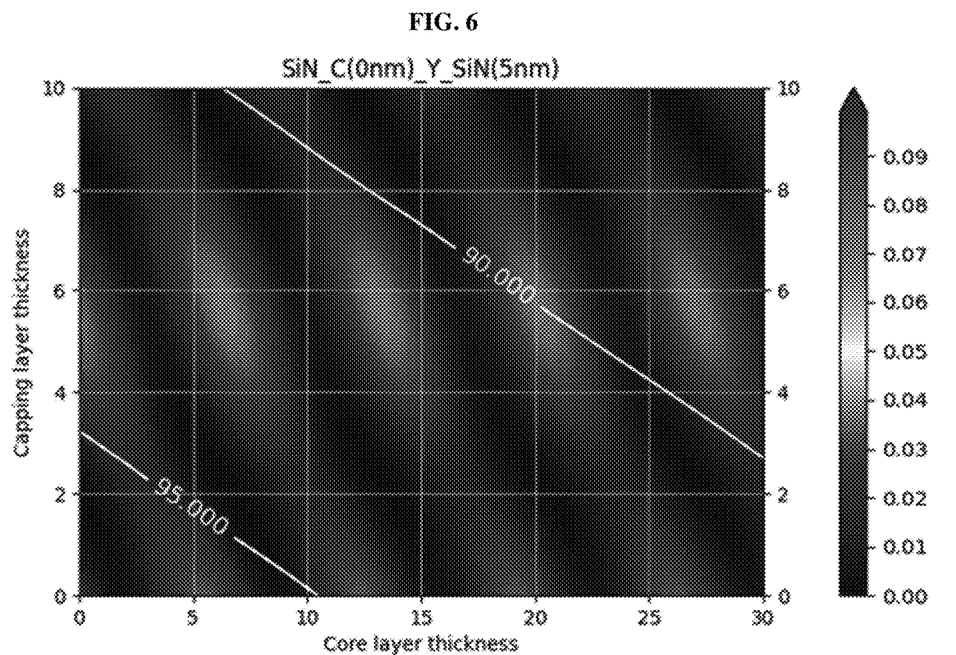
FIG. 6 is a graph showing transmittance and reflectance of an yttrium-based pellicle for extreme ultraviolet lithography according to a first experimental example of the present disclosure.

FIG. 6 is a graph showing transmittance and reflectance of an yttrium-based pellicle for extreme ultraviolet lithography according to a first experimental example of the present disclosure.

Referring to FIG. 6, the pellicle according to the first experimental example was expressed as "SiN_C(0 nm)_Y_SiN(5 nm)".

When the thickness of the core layer is 30 nm or less and the thickness of the capping layer is 10 nm or less, the transmittance is 90% or more.

In addition, when the thickness of the core layer is 30 nm or less and the thickness of the capping layer is 1 to 4 nm or 7 to 10 nm, it can be seen that the transmittance is 0.04% or less.

Second Experimental Example

Figure 7:
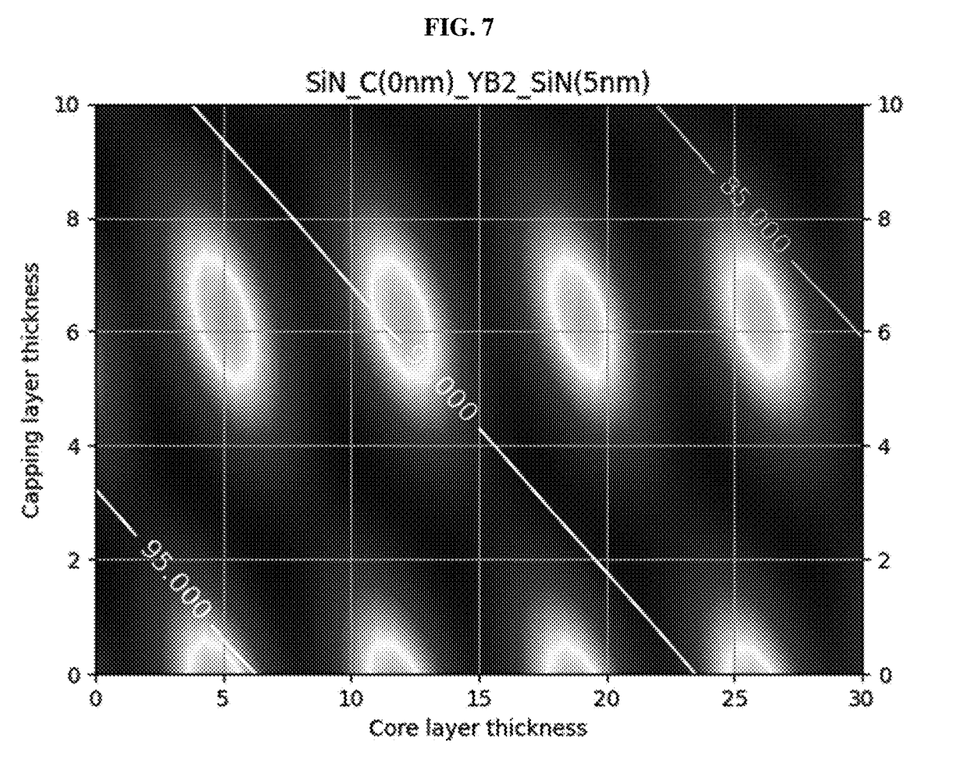
FIG. 7 is a graph showing transmittance and reflectance of an yttrium-based pellicle for extreme ultraviolet lithography according to a second experimental example of the present disclosure.

FIG. 7 is a graph showing transmittance and reflectance of an yttrium-based pellicle for extreme ultraviolet lithography according to a second experimental example of the present disclosure.

Referring to FIG. 7, the pellicle according to the second experimental example was expressed as "SiN_C(0 nm)_YB2_SiN(5 nm)".

When the thickness of the core layer is 24 nm or less and the thickness of the capping layer is 10 nm or less, the transmittance is 90% or more.

In addition, when the thickness of the core layer is 30 nm or less and the thickness of the capping layer is 2 to 5 nm or 8 to 10 nm, it can be seen that the transmittance is 0.04% or less.

Third Experimental Example

Figure 8:
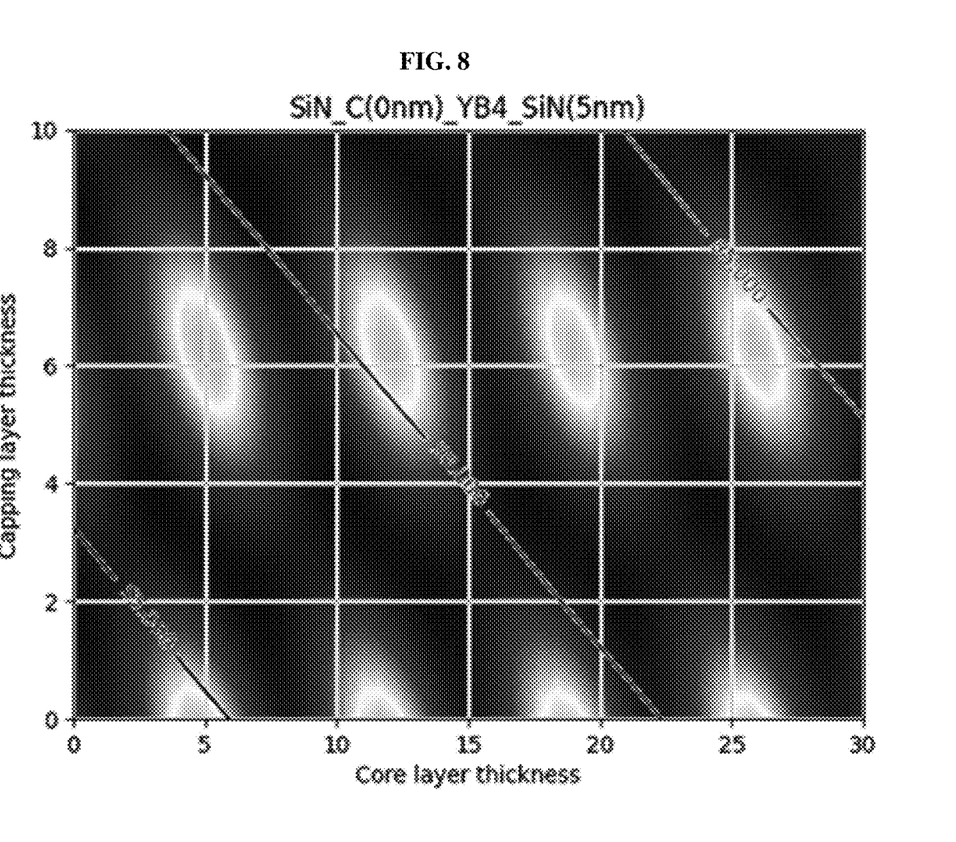
FIG. 8 is a graph showing transmittance and reflectance of an yttrium-based pellicle for extreme ultraviolet lithography according to a third experimental example of the present disclosure.

FIG. 8 is a graph showing transmittance and reflectance of an yttrium-based pellicle for extreme ultraviolet lithography according to a third experimental example of the present disclosure.

Referring to FIG. 8, the pellicle according to the third experimental example was expressed as "SiN_C(0 nm)_YB4_SiN(5 nm)".

When the thickness of the core layer is 23 nm or less and the thickness of the capping layer is 10 nm or less, the transmittance is 90% or more.

In addition, when the thickness of the core layer is 30 nm or less and the thickness of the capping layer is 1 to 5 nm or 8 to 10 nm, it can be seen that the transmittance is 0.04% or less.

Fourth Experimental Example

Figure 9:
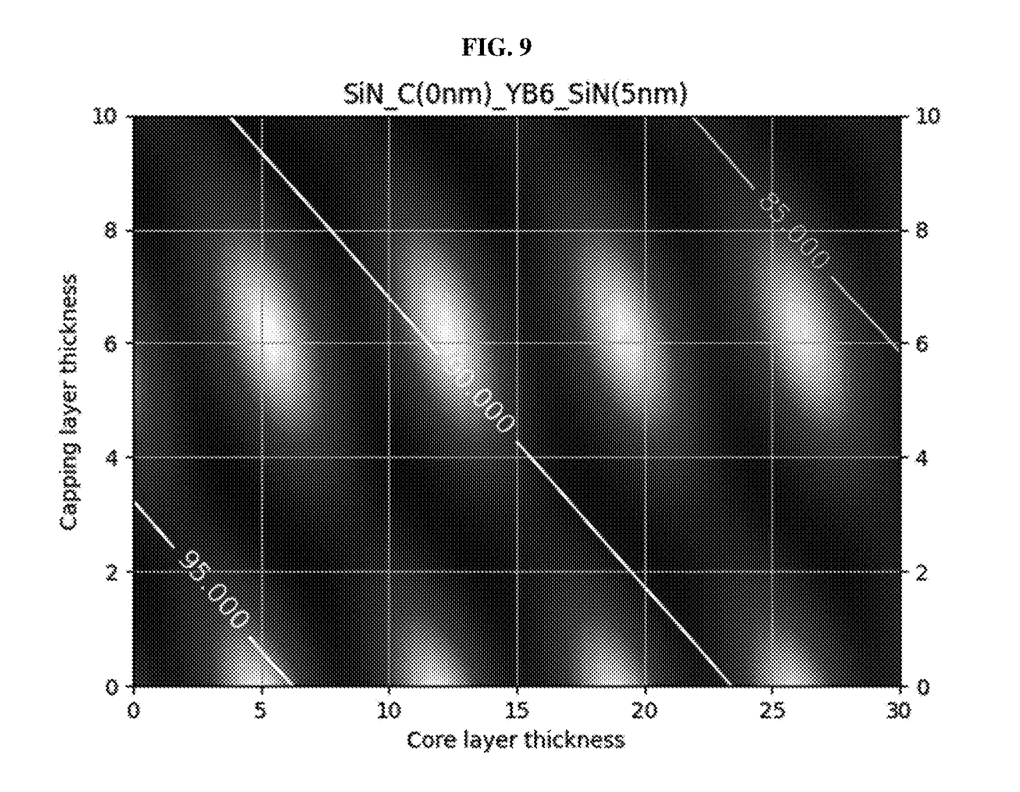
FIG. 9 is a graph showing transmittance and reflectance of an yttrium-based pellicle for extreme ultraviolet lithography according to a fourth experimental example of the present disclosure.

FIG. 9 is a graph showing transmittance and reflectance of an yttrium-based pellicle for extreme ultraviolet lithography according to a fourth experimental example of the present disclosure.

Referring to FIG. 9, the pellicle according to the fourth experimental example was expressed as "SiN_C(0 nm)_YB6_SiN(5 nm)".

When the thickness of the core layer is 24 nm or less and the thickness of the capping layer is 10 nm or less, the transmittance is 90% or more.

In addition, when the thickness of the core layer is 30 nm or less and the thickness of the capping layer is 1 to 5 nm or 8 to 10 nm, it can be seen that the transmittance is 0.04% or less.

Fifth Experimental Example

Figure 10:
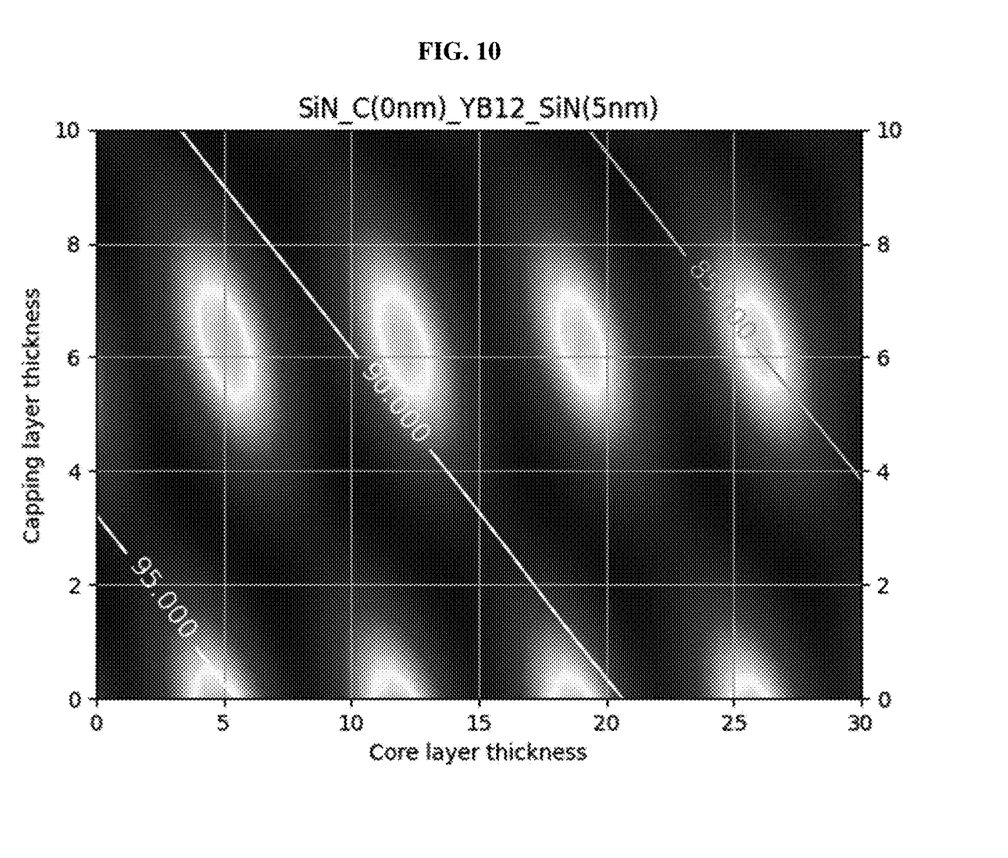
FIG. 10 is a graph showing transmittance and reflectance of an yttrium-based pellicle for extreme ultraviolet lithography according to a fifth experimental example of the present disclosure.

FIG. 10 is a graph showing transmittance and reflectance of an yttrium-based pellicle for extreme ultraviolet lithography according to a fifth experimental example of the present disclosure.

Referring to FIG. 10, the pellicle according to the fifth experimental example was expressed as "SiN_C(0 nm)_YB12_SiN(5 nm)".

When the thickness of the core layer is 21 nm or less and the thickness of the capping layer is 10 nm or less, the transmittance is 90% or more.

In addition, when the thickness of the core layer is 30 nm or less and the thickness of the capping layer is 1 to 5 nm or 8 to 10 nm, it can be seen that the transmittance is 0.04% or less.

Sixth Experimental Example

Figure 11:
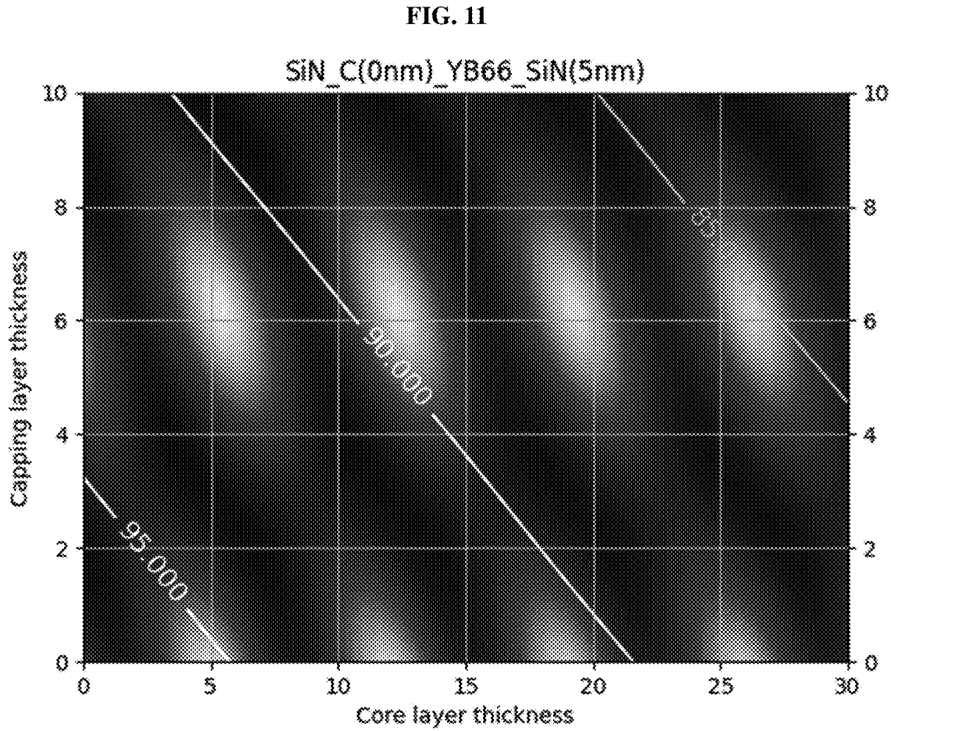
FIG. 11 is a graph showing transmittance and reflectance of an yttrium-based pellicle for extreme ultraviolet lithography according to a sixth experimental example of the present disclosure.

FIG. 11 is a graph showing transmittance and reflectance of an yttrium-based pellicle for extreme ultraviolet lithography according to a sixth experimental example of the present disclosure.

Referring to FIG. 11, the pellicle according to the sixth experimental example was expressed as "SiN_C(0 nm)_YB66_SiN(5 nm)".

When the thickness of the core layer is 22 nm or less and the thickness of the capping layer is 10 nm or less, the transmittance is 90% or more.

In addition, when the thickness of the core layer is 30 nm or less and the thickness of the capping layer is 1 to 5 nm or 8 to 10 nm, it can be seen that the transmittance is 0.04% or less.

As such, according to the first to sixth experimental examples, it can be seen that, by using the yttrium-based material as the material of the core layer, the pellicle having an extreme ultraviolet transmittance of 90% or more and having a reflectance of 0.04% or less can be provided.

In addition, it can be seen that, even if the capping layer used as the protective layer of the core layer is formed to a thickness of 10 nm, the pellicle having an extreme ultraviolet transmittance of 90% or more and having a reflectance of 0.04% or less can be provided.

While the present disclosure has been particularly shown and described with reference to an exemplary embodiment thereof, it will be understood by those skilled in the art that various changes in form and details may be made therein without departing from the scope of the present disclosure as defined by the appended claims.

What is claimed is:

1. A pellicle for extreme ultraviolet lithography, the pellicle comprising:
a pellicle layer including a core layer formed of an yttrium-based material expressed as Y-M, wherein M is one of Si, O, or F.

2. The pellicle of claim 1, wherein the yttrium-based material includes Y—$Si_x$ (x≥1), $Y_2O_3$, or $YF_3$.

3. The pellicle of claim 1, wherein the yttrium-based material includes $YSi_2$ or $Y_3Si_5$.

4. The pellicle of claim 1, wherein the pellicle layer includes:
the core layer; and
a capping layer formed on one or both surfaces of the core layer,
wherein the capping layer includes Y-M-α (M is one of B, Si, O, or F, and α is one of Si, C, B, N, O, or Ru).

5. The pellicle of claim 4, wherein the capping layer includes $YC_xSi_y$ (x+y≥1), $YC_xB_y$ (x+y≥1), $YSi_xN_y$ (x+y≥1), $YC_x$ (x≥1), $YSi_x$ (x≥1), $YN_x$ (x≥1), $SiN_x$ (x≥1), $SiO_2$, $B_4C$, or RuC.

6. The pellicle of claim 1, wherein the pellicle layer includes:
the core layer;
an intermediate layer formed on one or both surfaces of the core layer; and
a capping layer formed on the intermediate layer,
wherein each of the intermediate layer and the capping layer includes Y-M-α (M is one of B, Si, O, or F, and α is one of Si, C, B, N, O, or Ru).

7. The pellicle of claim 6, wherein each of the intermediate layer and the capping layer includes $YC_xSi_y$ (x+y≥1), $YC_xB_y$ (x+y≥1), $YSi_xN_y$ (x+y≥1), $YC_x$ (x≥1), $YSi_x$ (x≥1), $YN_x$ (x≥1), $SiN_x$ (x≥1), $SiO_2$, $B_4C$, or RuC.

8. A pellicle for extreme ultraviolet lithography, the pellicle comprising:
a substrate having an opening formed in a central portion thereof; and
a pellicle layer formed on the substrate so as to cover the opening and including a core layer formed of an yttrium-based material expressed as Y-M, wherein M is one of Si, O, or F.

9. The pellicle of claim 8, wherein the yttrium-based material includes Y—$Si_x$ (x≥1), $Y_2O_3$, or $YF_3$.

10. The pellicle of claim 8, wherein the pellicle layer includes:
the core layer formed on the substrate so as to cover the opening; and
a capping layer formed on the core layer,
wherein the capping layer includes Y-M-α (M is one of B, Si, O, or F, and α is one of Si, C, B, N, O, or Ru).

11. The pellicle of claim 10, wherein the capping layer includes $YC_xSi_y$ (x+y≥1), $YC_xB_y$ (x+y≥1), $YSi_xN_y$ (x+y≥1), $YC_x$ (x≥1), $YSi_x$ (x≥1), $YN_x$ (x≥1), $SiN_x$ (x≥1), $SiO_2$, $B_4C$, or RuC.

12. The pellicle of claim 8, wherein the pellicle layer includes:
the core layer formed on the substrate so as to cover the opening;
an intermediate layer formed on one or both surfaces of the core layer; and
a capping layer formed on the intermediate layer,
wherein each of the intermediate layer and the capping layer includes Y-M-α (M is one of B, Si, O, or F, and α is one of Si, C, B, N, O, or Ru).

13. The pellicle of claim 12, wherein each of the intermediate layer and the capping layer includes $YC_xSi_y$ (x+y≥1), $YC_xB_y$ (x+y≥1), $YSi_xN_y$ (x+y≥1), $YC_x$ (x≥1), $YSi_x$ (x≥1), $YN_x$ (x≥1), $SiN_x$ (x≥1), $SiO_2$, $B_4C$, or RuC.

14. A pellicle for extreme ultraviolet lithography, the pellicle comprising:
a pellicle layer including:
a core layer formed of an yttrium-based material expressed as Y-M, wherein M is one of B, Si, O, or F; and
a capping layer formed on one or both surfaces of the core layer, and formed of an yttrium-based material expressed as Y-M-α, wherein M is one of B, Si, O, or F, and α is one of Si, C, B, N, O, or Ru.

15. The pellicle of claim 14, wherein the yttrium-based material includes Y—$B_x$ (x≥2), Y—$Si_x$ (x≥1), $Y_2O_3$, or $YF_3$.

16. The pellicle of claim 14, wherein the yttrium-based material includes $YB_2$, $YB_4$, $YB_6$, $YB_{12}$, $YB_{25}$, $YB_{50}$, or $YB_{66}$.

* * * * *